(12) United States Patent
Gopinathan et al.

(10) Patent No.: US 7,282,994 B2
(45) Date of Patent: Oct. 16, 2007

(54) ACTIVE LOAD WITH ADJUSTABLE COMMON-MODE LEVEL

(75) Inventors: Venugopal Gopinathan, Bangalore (IN); Sherif Hassan Galal, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 138 days.

(21) Appl. No.: 11/180,678

(22) Filed: Jul. 14, 2005
(Under 37 CFR 1.47)

(65) Prior Publication Data
US 2006/0082415 A1    Apr. 20, 2006

Related U.S. Application Data

(60) Provisional application No. 60/618,263, filed on Oct. 14, 2004.

(51) Int. Cl.
*H03F 3/45* (2006.01)
(52) U.S. Cl. ........................ 330/253; 330/258
(58) Field of Classification Search ............... 330/253, 330/257, 258, 310, 311, 98, 150
See application file for complete search history.

(56) References Cited

U.S. PATENT DOCUMENTS 4,336,502 A * 6/1982 Goto ........................ 330/253
6,784,749 B1 * 8/2004 Cove ........................ 330/308
7,142,056 B2 * 11/2006 Blecker et al. ............. 330/253

* cited by examiner

*Primary Examiner*—Henry Choe
(74) *Attorney, Agent, or Firm*—Sterne, Kessler, Goldstein & Fox P.L.L.C.

(57) ABSTRACT

A differential preamplifier includes an active load with adjustable common-mode output level. The active load includes a transistor pair, a resistor pair, and a current source. The transistor load is employed to provide high gain, low offset, and a large bandwidth for the differential preamplifier. The resistor pair and current source are used to increase the common-mode output level of the differential preamplifier and to bias the transistor load. The current source can be varied to provide an adjustable common-mode output level suitable for driving next stage devices. The active load design allows the differential preamplifier to operate using only low power voltage supplies and with small-sized transistors.

30 Claims, 6 Drawing Sheets

ACTIVE LOAD WITH ADJUSTABLE COMMON-MODE LEVEL

CROSS REFERENCE TO RELATED APPLICATIONS

This application claims the benefit of U.S. Provisional Patent Application No. 60/618,263, filed Oct. 14, 2004, which is incorporated herein by reference in its entirety.

BACKGROUND OF THE INVENTION

1. Field of the Invention

The present invention generally relates to differential amplifiers. More specifically, the present invention provides a high gain differential preamplifier having an adjustable common-mode output level that can be adjusted to drive an output circuit.

2. Background Art

A differential preamplifier is often incorporated into the front-end of a differential receiver to increase overall receiver sensitivity. Specifically, a differential preamplifier is used to amplify or boost the signal strength of low power received signals so that the next stage differential receiver components operate as designed.

To adequately amplify a low power received signal, differential preamplifiers must be designed to achieve high gain. Further, differential preamplifiers are usually required to operate over a large bandwidth and to introduce minimal offset. To meet these stringent requirements, differential preamplifiers use transistors as active loads to boost overall gain and to minimize offset. Introduction of transistor loads, however, often results in low common-mode output voltage levels. If the common-mode output voltage level is too low, the differential preamplifier will not be able to power or drive the next stage of a differential receiver front-end that is coupled to the output of the differential preamplifier.

One method of increasing common-mode output levels without sacrificing the desirable features of active transistor loads is to increase the physical size of the transistors. Increasing the physical size of the transistors, however, increases the capacitance of the transistor loads. In turn, the bandwidth of the differential preamplifier is decreased. Alternatively, common-mode output levels can be boosted by increasing voltage supply levels of the differential preamplifier. As the desire for low power differential receiver applications has risen, however, the ability to supply differential preamplifiers with high voltage supplies has become impractical. There is therefore a need for a differential preamplifier design that uses small-sized transistor loads and low power voltage supplies, yet remains capable of providing a common-mode output level that can drive follow-on circuits.

BRIEF SUMMARY OF THE INVENTION

In one embodiment, the present invention is a differential preamplifier that provides an increased common-mode output voltage level without the need to increase the size of the active transistor loads or the need to increase supply voltages. In an embodiment, the present invention uses active transistor loads complemented by biasing circuitry to enable an adjustable common-mode output level. The present invention thereby retains the benefits associated with transistor loads while providing a common-mode output voltage suitable for driving next stage components.

In another embodiment, the present invention is a differential amplifier having a first stage configured to receive a differential input signal and a second stage coupled to the output of the first stage. The second stage includes an active load having a transistor pair that has their gates connected together at a common node. The transistor pair provides a differential output signal at the respective output terminals of the active load. The second stage also includes a bias circuit that provides bias voltages to the transistor pair in the active load. The bias circuit is configured to provide an adjustable common-mode output voltage at the respective output terminals of the active load and to keep the transistor pair in saturation. The bias circuit includes a current source coupled to the common node. The bias circuit also includes a resistor pair coupled between the respective gates and drains of the transistor pair. The current source is adjusted so that the respective voltage drops across the resistors provide a desired common-mode voltage at the output terminals of the active load. The current source can be adjusted by a feedback loop system that is coupled to the output terminals of the active load. The feedback loop system can monitor the common-mode voltage at the output terminals of the active load and can generate an output signal to adjust the current source to provide a desired common-mode voltage.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 4:
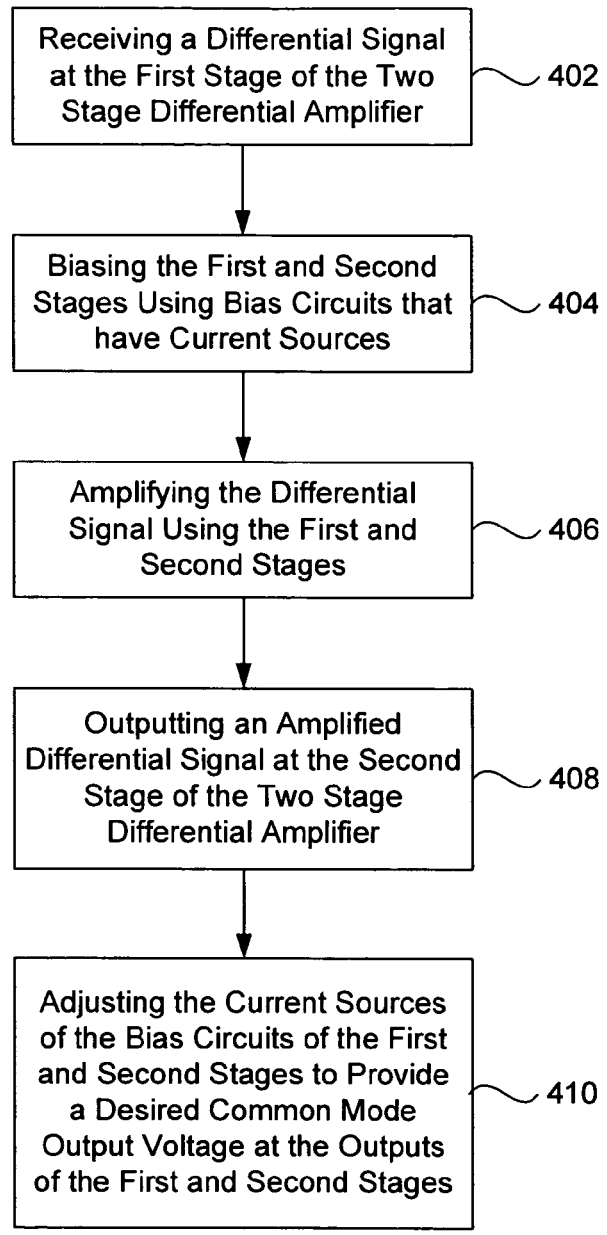

FIG. 4 provides a flowchart of a method 400 for providing an adjustable common-mode output voltage at the output terminals of a two stage differential amplifier having active loads.

Figure 5:
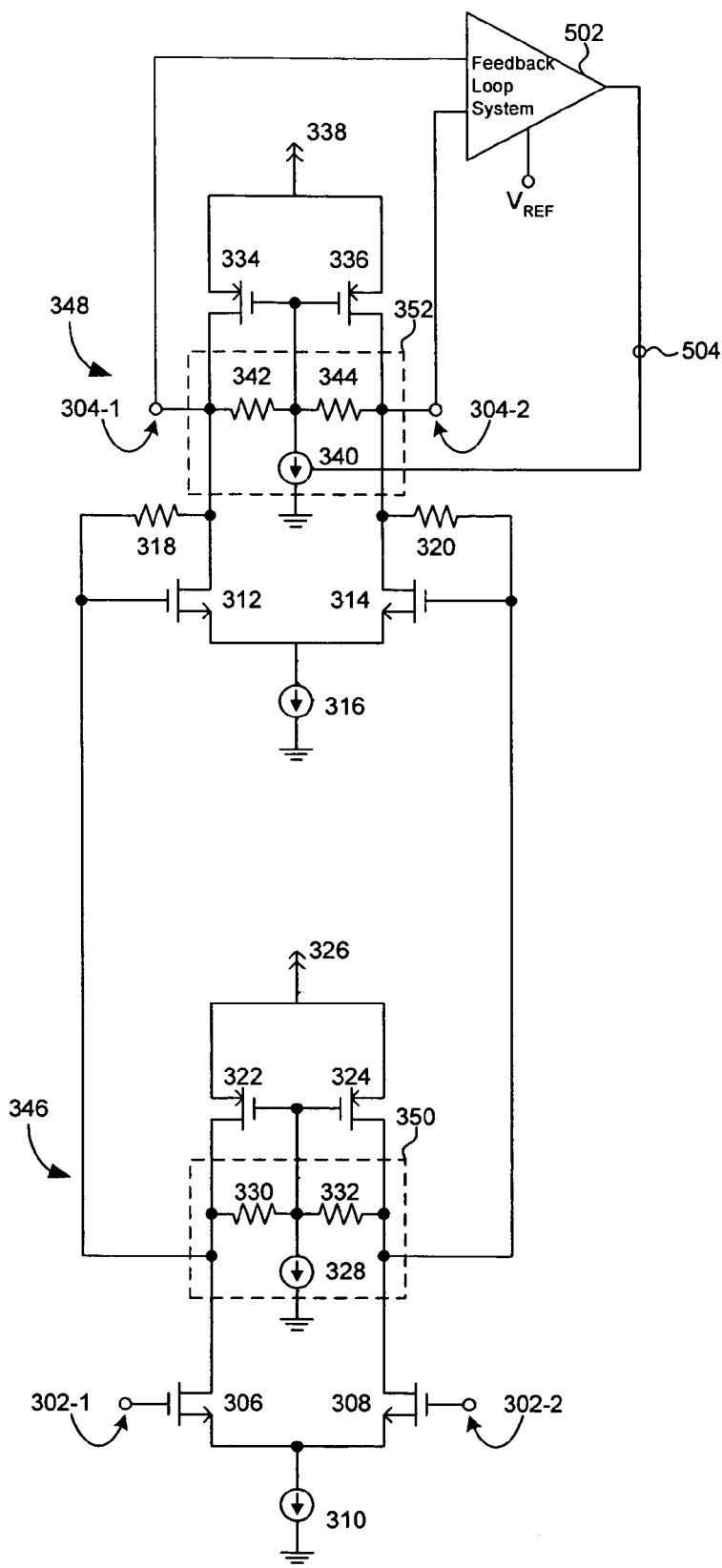

FIG. 5 illustrates an embodiment of the present invention that provides for the common-mode output voltage of a two stage differential amplifier to be adjusted by a feedback loop system.

Figure 6:
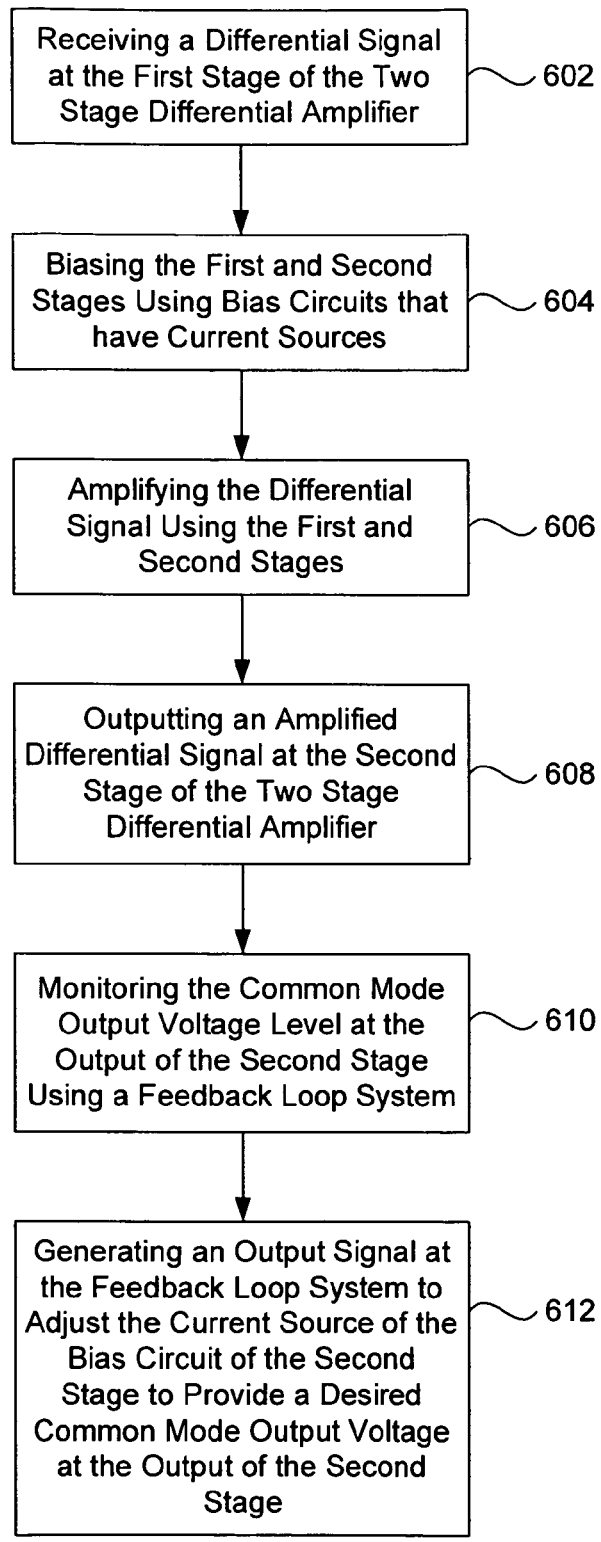

FIG. 6 provides a flowchart of a method 600 for using a feedback loop system to adjust the common-mode voltage at the output of a second stage of a two stage differential amplifier having active loads.

DETAILED DESCRIPTION OF THE INVENTION

Figure 1:
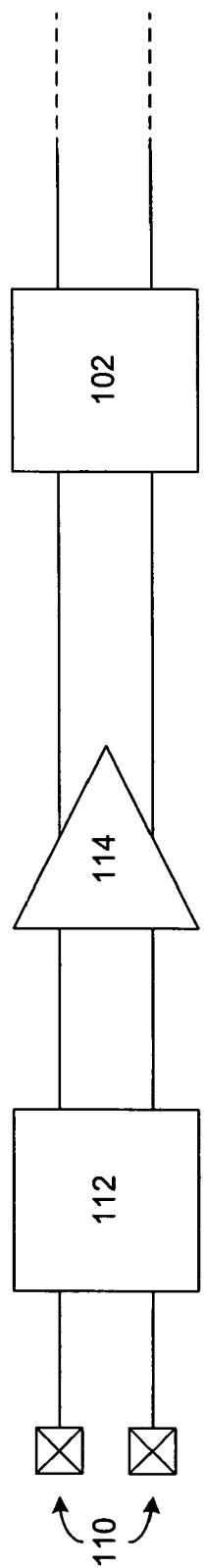
FIG. 1 illustrates an exemplary differential receiver front-end 100.

FIG. 1 illustrates an exemplary differential receiver front-end 100. Differential receiver front-end 100 receives a differential input signal at differential input pad 110. Differential receiver front-end 100 includes differential equalizer 112. Differential equalizer 112 is designed to equalize the low and high frequency contents of the differential input signal received at differential input pad 110. Differential receiver front-end 100 also includes differential preamplifier 114. Differential preamplifier 114 amplifies or boosts the differential input signal received at differential input pad 110. This is necessary, in part, because differential equalizer 112 attenuates the signal strength of the differential input signal received at differential input pad 110. Therefore, to compensate, differential preamplifier 114 should provide gain over a large bandwidth while introducing minimal offset. The equalized and amplified differential input signal is then passed to differential receiver core 102.

Figure 2:
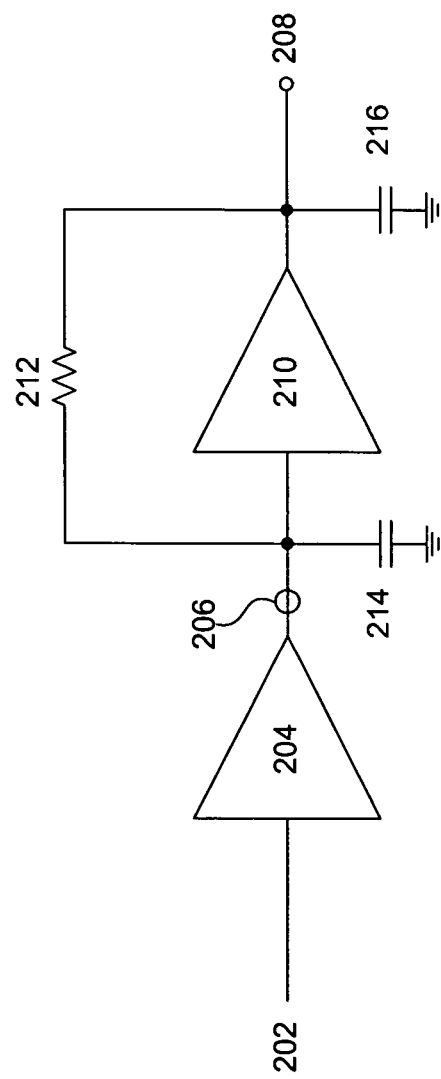
FIG. 2 illustrates two stage preamplifier 200.

FIG. 2 illustrates a two stage preamplifier 200. Two stage preamplifier 200 provides a gain in signal strength over a large bandwidth while introducing only minimal offset. Two stage preamplifier 200 receives an input voltage 202. First transconductance stage 204 converts input voltage 202 into current 206. Second transconductance stage 210 and feedback resistor 212 convert current 206 into an output voltage 208. Capacitor 214 represents the input capacitance and capacitor 216 represents the load capacitance of two stage preamplifier 200.

Two stage preamplifier 200 is often employed as a preamplifier stage in a receiver front-end. However, two stage preamplifier 200 may not be adequate for driving next stage receiver components. Specifically, two stage preamplifier 200 may not provide a suitable common-mode output level that can sufficiently power or drive a next stage device or component.

Figure 3:
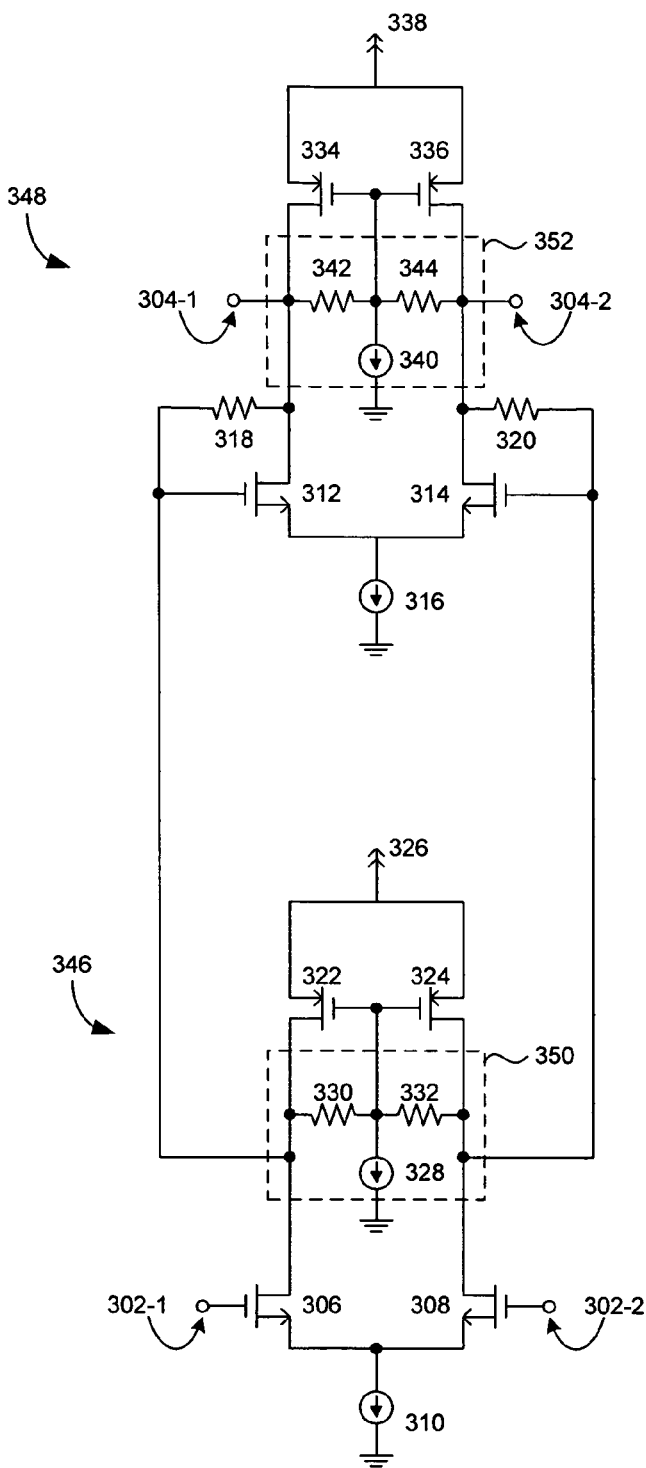
FIG. 3 illustrates two stage differential preamplifier 300 that is one embodiment of two stage preamplifier 200.

FIG. 3 illustrates two stage differential preamplifier 300 that is one embodiment of the two stage preamplifier 200 depicted in FIG. 2. Specifically, FIG. 3 presents two stage differential preamplifier 300 having active loads and adjustable common-mode output levels. The ability to adjust the common-mode output levels of two stage differential preamplifier 300 makes two stage differential preamplifier 300 suitable to power or drive a next stage device or component.

Two stage differential preamplifier 300 receives a differential input signal at differential inputs 302-1 and 302-2 and outputs a differential output signal at differential outputs 304-1 and 304-2. At a first stage 346 of two stage differential preamplifier 300, differential input 302-1 is connected to the gate of n-channel type metal oxide semiconductor field effect (NMOS) transistor 306. Differential input 302-2 is connected to the gate of NMOS transistor 308. The sources of NMOS transistors 306 and 308 are each connected to current source 310. The differential output of first stage 346 of two stage differential preamplifier 300 is taken from the drains of NMOS transistors 306 and 308 and effectively feeds a second stage 348 of two stage differential preamplifier 300.

At second stage 348 of two stage differential preamplifier 300, the gates of NMOS transistors 312 and 314 are connected to the differential output of first stage 348 of two stage differential preamplifier 300. Specifically, the gates of NMOS transistors 312 and 314 are connected to the drains of NMOS transistors 306 and 308, respectively. The sources of NMOS transistors 312 and 314 are connected to current source 316. Further, feedback resistor 318 is connected between the gate and drain of NMOS transistor 312 while feedback resistor 320 is connected between the gate and drain of NMOS transistor 314.

The active load of first stage 346 of two stage differential preamplifier 300 is connected across the drains of NMOS transistors 306 and 308. The active load of first stage 346 of two stage differential preamplifier 300 includes p-channel type metal oxide semiconductor field effect (PMOS) transistors 322 and 324. The sources of PMOS transistors 322 and 324 are connected to voltage supply 326 and the drains of PMOS transistors 322 and 324 are connected to the drains of NMOS transistors 306 and 308, respectively. The gates of PMOS transistors 322 and 324 are connected together to form a common node.

The active load of first stage 346 of two stage differential preamplifier 300 also includes bias circuit 350. Bias circuit 350 includes current source 328 connected to the gates of PMOS transistors 322 and 324. Bias circuit 350 also includes resistor 330 connected between the gate and drain of PMOS transistor 322 and resistor 332 connected between the gate and drain of PMOS transistor 324.

The arrangement of the active load of second stage 348 of two stage differential preamplifier 300 follows the arrangement of the active load of first stage 346 of two stage differential preamplifier 300. Specifically, the active load of second stage 348 of two stage differential amplifier 300 is connected across the drains of NMOS transistors 312 and 314. The active load of second stage 348 of two stage differential amplifier 300 includes PMOS transistors 334 and 336. The sources of PMOS transistors 334 and 336 are connected to voltage supply 338 and the drains of PMOS transistors 334 and 336 are connected to the drains of NMOS transistors 312 and 314, respectively. The gates of PMOS transistors 334 and 336 are connected together to form a common node.

The active load of second stage 348 of two stage differential preamplifier 300 also includes bias circuit 352. Bias circuit 352 includes current source 340 connected to the gates of PMOS transistors 334 and 336. Bias circuit 352 also includes resistor 342 connected between the gate and drain of PMOS transistor 334 and resistor 344 connected between the gate and drain of PMOS transistor 336.

Together, first stage 346 of two stage differential preamplifier 300 is an input stage and second stage 348 of two stage differential preamplifier 300 is an output stage.

The arrangement of resistors 342 and 344 and current source 340 in bias circuit 352 results in half of the current generated by current source 340 flowing through resistor 342 and the other half flowing through resistor 344. The arrangement of resistors 342 and 344 and current source 340 also establishes a common-mode point at the gates of PMOS transistors 334 and 336. The voltage drops across resistors 342 and 344 elevate the common-mode output voltage level at differential outputs 304-1 and 304-2 relative to the common-mode point. The voltage drops across resistors 342 and 344 also ensure the proper biasing of PMOS transistors 334 and 336. To keep PMOS transistors 334 and 336 in saturation, the voltage level applied to the gates of PMOS transistors 334 and 336 is low. The voltage drop across resistor 342 ensures a low voltage is applied to the gate of PMOS transistor 334. Likewise, the voltage drop across resistor 344 ensures a low voltage is applied to the gate of PMOS transistor 336. The arrangement of resistors 342 and 344 and current source 340 therefore provides a high common-mode output level at differential outputs 304-1 and 304-2 while simultaneously accommodating the proper biasing of the active load of second stage 348 of two stage differential preamplifier 300.

The common-mode output level provided by the voltage drops across resistors 342 and 344 is adjustable through the use of current source 340. That is, current source 340 can be varied to provide a desired common-mode output level by determining the voltage drops across resistors 342 and 344. Further, the required voltage drops across resistors 342 and 344 can be achieved with a small current generated from current source 340 by selecting larger resistance values for resistors 342 and 344. The voltage drops across resistors 342 and 344, however, should account for the threshold voltages of PMOS transistors 334 and 336. Specifically, PMOS transistor 334 will remain in saturation provided that the voltage drop across resistor 342 does not exceed the threshold voltage of PMOS transistor 334. Similarly, PMOS transistors 336 will remain in saturation provided that the voltage drop across resistor 344 does not exceed the threshold voltage of PMOS transistor 336.

The present invention also provides an adjustable common-mode output level at first stage 346 of two stage differential preamplifier 300. Specifically, current source 328 and resistors 330 and 332 can be adjusted to provide a desired common-mode output level to drive second stage 348 of two stage differential preamplifier 300.

The active loads with adjustable common-mode output levels provided by the present invention enables two stage differential preamplifier 300 to achieve a desired common-mode output level at differential outputs 304-1 and 304-2 suitable for low power, multiple stage circuit designs. Specifically, the present invention allows two stage differential preamplifier to operate with the use of low power voltage supplies 338 and 326. For example, for supply voltages of approximately 1.2 volts, common-mode output levels of approximately 650 to 700 mV can be provided. Further, the present invention obviates the need to increase the physical size of PMOS transistors 334 and 336 to achieve a desired common-mode output level which would compromise the bandwidth of two stage differential preamplifier 300. Also, the introduction of current sources 340 and 328 do not limit the bandwidth of two stage differential preamplifier 300 since the capacitance introduced by current sources 340 and 328 are at common-mode points.

FIG. 4 provides a flowchart of a method 400 for providing an adjustable common-mode output voltage at the output terminals of a two stage differential amplifier having active loads. Beginning with step 402, the two stage differential amplifier receives a differential signal at the first stage of the two stage amplifier. At step 404, the first and second stages of the two stage amplifier are biased using bias circuits that have current sources coupled to the active loads at their common-mode point. At step 406, the differential signal is amplified by the first and second stages of the two stage differential amplifier. At step 408, the amplified differential signal is outputted at the second stage of the two stage differential amplifier. At step 410, the current sources of the bias circuits of the first and second stages are adjusted to provide a desired common-mode output voltage at the outputs of the first and second stages of the two stage differential amplifier. Specifically, adjusting the current sources adjusts the voltage drops across the bias circuit resistors that are coupled between the outputs of the first and second stages and their respective common-mode points.

FIG. 5 illustrates an embodiment of the present invention which provides for the common-mode output level to be adjusted by feedback loop system 502. Feedback loop system 502 is connected to differential outputs 304-1 and 304-2 and to current source 340. Feedback loop system 502 is also connected to a reference common-mode level $V_{REF}$. Feedback loop system 502 monitors the common-mode output level at differential outputs 304-1 and 304-2 and adjusts current source 340 to achieve a desired common-mode output level (i.e., $V_{REF}$). Specifically, feedback loop system 502 generates an output signal 504 based on inputs from differential outputs 304-1 and 304-2 and reference common-mode level $V_{REF}$. Output signal 504 is used to fine tune current source 340 and therefore provide the desired voltage drops across resistors 342 and 344.

FIG. 6 provides a flowchart of a method 600 for using a feedback loop system to adjust the common-mode voltage at the output of a second stage of a two stage differential amplifier having active loads. Beginning with step 602, the two stage differential amplifier receives a differential signal at the first stage of the two stage amplifier. At step 604, the first and second stages of the two stage amplifier are biased using bias circuits that have current sources coupled to the active loads at their common-mode points. At step 606, the differential signal is amplified by the first and second stages of the two stage differential amplifier. At step 608, the amplified differential signal is outputted at the second stage of the two stage differential amplifier.

At step 610, the feedback loop system, coupled to the output of the second stage, monitors the common-mode voltage at the output of the second stage. At step 612, the feedback loop system adjusts the current source of the bias circuit of the second stage to provide a desired common-mode output voltage at the output of the stage based on a reference common-mode level. Specifically, the feedback loop system generates an output signal that increases or decreases the current source setting. In turn, this adjusts the voltage drops across the resistors that are coupled between the output of the second stage and its common-mode point, thereby providing a desired common-mode output voltage level at the output of the second stage.

In embodiments of the invention, the NMOS and PMOS transistors are produced using standard complementary metal oxide semiconductor (CMOS) processes. Other processes and transistors could be used as will be understood by those skilled in the arts, based on the discussion given herein. For example, the invention can include the use of Bipolar Junction Transistor (BJT) technology. Specifically, NMOS transistors and PMOS transistors can be replaced by NPN and PNP BJT transistors, respectively.

Further, in embodiments of the present invention, the active load with adjustable common-mode output level can be used with various differential amplifier designs including single stage and multiple stage amplifiers, as will be understood by those skilled in the arts.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A differential amplifier, comprising:
   a first stage configured to receive a differential input signal; and
   a second stage, coupled to an output of the first stage, including:
      an active load having a transistor pair that provides a differential output signal at respective output terminals of the active load; and
      a bias circuit that provides bias voltages to the transistor pair in the active load, and configured to provide an adjustable common-mode voltage at respective output terminals of the active load.

2. The differential amplifier of claim 1, wherein the transistor pair has their gates connected together at a common node, the bias circuit further comprising:
   a current source coupled to the common node;
   a first resistor coupled between a gate and a drain of a first transistor of the transistor pair, and a second resistor coupled between a gate and a drain of a second transistor of the transistor pair.

3. The differential amplifier of claim 2, wherein the current source is determined so that respective voltage drops across the first and second resistors provide a desired common-mode voltage at the output terminals of the active load.

4. The differential amplifier of claim 3, wherein the current source is determined so that respective voltage drops across the first and second resistors place the transistor pair in saturation.

5. The differential amplifier of claim 3, wherein the current source is determined by a feedback loop system coupled to the output terminals of the active load.

6. The differential amplifier of claim 5, wherein the feedback loop system monitors the common-mode voltage at the output terminals of the active load and generates an output signal to adjust the current source.

7. The differential amplifier of claim 1, wherein the transistor pair in the active load is a PMOS transistor pair.

8. A differential amplifier, comprising:
a first transistor pair configured to receive a differential input signal; and
an active load, coupled to the first transistor pair, including:
a second transistor pair that provides a differential output signal at respective output terminals of the active load; and
a bias circuit that provides bias voltages to the second transistor pair, and configured to provide an adjustable common-mode voltage at respective output terminals of the active load.

9. The differential amplifier of claim 8, wherein the second transistor pair has their gates connected together at a common node, the bias circuit further comprising:
a current source coupled to the common node;
a first resistor coupled between a gate and a drain of a first transistor of the second transistor pair, and a second resistor coupled between a gate and a drain of a second transistor of the second transistor pair.

10. The differential amplifier of claim 8, wherein the current source is determined so that respective voltage drops across the first and second resistors provide a desired common-mode voltage at the output terminals of the active load.

11. The differential amplifier of claim 10, wherein the current source is determined so that respective voltage drops across the first and second resistors place the second transistor pair in saturation.

12. The differential amplifier of claim 10, wherein the current source is determined by a feedback loop system coupled to the output terminals of the active load.

13. The differential amplifier of claim 12, wherein the feedback loop system monitors the common-mode voltage at the output terminals of the active load and generates an output signal to adjust the current source.

14. The differential amplifier of claim 8, wherein the first transistor pair is a NMOS transistor pair and the second transistor pair is a PMOS transistor pair.

15. In a differential amplifier having an active load, the active load including a first resistor coupled between a common node and a first output terminal of the active load and a second resistor coupled between the common node and a second output terminal of the active load, a method of providing an adjustable common-mode voltage at the respective output terminals of the active load, the method comprising the steps of:
(a) biasing the active load using a current source coupled to the active load at the common node; and (b) adjusting the current source to provide desired voltage drops across the first and second resistors, wherein respective voltage drops across the first and second resistors provide the adjustable common-mode voltage at the output terminals of the active load.

16. The method of claim 15, further comprising the step of receiving a differential signal at an input transistor pair of the differential amplifier.

17. The method of claim 16, further comprising the step of amplifying the differential signal using the active load.

18. The method of claim 17, further comprising the step of outputting an amplified differential signal at the respective output terminals of the active load.

19. The method of claim 15, further comprising the step of outputting the common-mode voltage at the output terminals of the active load to drive a follow-on circuit.

20. The method of claim 15, wherein the first resistor of the active load and the second resistor of the active load has their gates connected together at the common node.

21. The method of claim 20, wherein the input transistor pair is a NMOS transistor pair and the first resistor of the active load and the second resistor of the active load are PMOS transistors.

22. The method of claim 15, wherein step (e) includes adjusting the current source with a feedback loop system coupled to the output terminals of the active load.

23. The method of claim 22, wherein step (e) includes monitoring the common-mode voltage at the output terminals of the active load with the feedback loop system and generating an output signal to adjust the current source.

24. A two stage differential amplifier having active loads with adjustable common-mode output voltages, comprising:
a differential amplifier input and a differential amplifier output;
a first differential amplifier stage including a first transistor pair, respective sources of the first transistor pair connected to a first current supply, respective gates of the first transistor pair connected to the differential amplifier input, respective drains of the first transistor pair connected to a first active load;
a second differential amplifier stage including a second transistor pair, respective sources of the second transistor pair connected to a second current supply, respective gates of the second transistor pair connected to the respective drains of the first transistor pair and forming a first differential amplifier stage output, respective drains of the second transistor pair connected to a second active load; and
a feedback resistor pair connecting the respective gates of the second transistor pair to the respective drains of the second transistor pair;
wherein:
the first active load includes a third transistor pair and a first active load resistor pair, respective sources of the third transistor pair connected to a first supply voltage, respective drains of the third transistor pair connected to the respective drains of the first transistor pair, respective gates of the third transistor pair connected to a third current source, the first active load resistor pair connecting the respective gates of the third transistor pair to the respective drains of the third transistor pair;
the second active load includes a fourth transistor pair and a second active load resistor pair, respective sources of the fourth transistor pair connected to a second supply voltage, respective drains of the fourth transistor pair connected to the respective drains of the second transistor pair, respective gates of the fourth transistor pair connected to a fourth current source, the second active load resistor pair connecting the respective gates of the fourth transistor pair to the respective drains of the fourth transistor pair; and the differential amplifier output is taken from the drains of the fourth transistor pair.

25. The two stage differential amplifier of claim 24, wherein the first transistor pair and second transistor pair are NMOS transistors and the third transistor pair and fourth transistor pair are PMOS transistors.

26. The two stage differential amplifier of claim 24, wherein the third current source is adjusted to set a first common-mode output voltage at the first differential amplifier stage output and the fourth current source is adjusted to set a second common-mode output voltage at the differential amplifier output.

27. The two stage differential amplifier of claim 26, wherein the second common-mode output voltage is used to drive a follow-on circuit.

28. The two stage differential amplifier of claim 26, wherein the third current source is adjusted to place the third transistor pair in saturation and the fourth current source is adjusted to place the fourth transistor pair in saturation.

29. The two stage differential amplifier of claim 24, wherein a feedback loop system, having inputs connected to the differential amplifier output and an output connected to the fourth current source, monitors the second common-mode output voltage and adjusts the fourth current source.

30. A differential amplifier having an active load with adjustable common-mode output voltage, comprising:
  a differential amplifier input and a differential amplifier output; and
  a first transistor pair, respective sources of the first transistor pair connected to a first current supply, respective gates of the first transistor pair connected to the differential amplifier input, respective drains of the first transistor pair connected to an active load;
wherein:
  the active load includes a second transistor pair and an active load resistor pair, respective sources of the second transistor pair connected to a first supply voltage, respective drains of the second transistor pair connected to the respective drains of the first transistor pair, respective gates of the second transistor pair connected to a second current source, the active load resistor pair connecting the respective gates of the second transistor pair to the respective drains of the second transistor pair; and
  the differential amplifier output is taken from the drains of the second transistor pair.

* * * * *

UNITED STATES PATENT AND TRADEMARK OFFICE
CERTIFICATE OF CORRECTION

PATENT NO. : 7,282,994 B2
APPLICATION NO. : 11/180678
DATED : October 16, 2007
INVENTOR(S) : Gopinathan et al.

It is certified that error appears in the above-identified patent and that said Letters Patent is hereby corrected as shown below:

Title Page
Item (75), Inventors section, please replace "Sherif Hassan Galal, Irvine, CA (US)" with -- Sherif Hassan Galal, Irvine, CA (EG) --.

Signed and Sealed this

Fifteenth Day of July, 2008

JON W. DUDAS
*Director of the United States Patent and Trademark Office*